United States Patent [19]
Alonso

[11] Patent Number: 6,067,802
[45] Date of Patent: May 30, 2000

[54] PELTIER EFFECT HEAT PUMP

[75] Inventor: Antonio Arenas Alonso, Alcorcón, Spain

[73] Assignee: Universidad Pontificia Comillas, Madrid, Spain

[21] Appl. No.: 09/264,876

[22] Filed: Mar. 9, 1999

[51] Int. Cl.[7] .................................................. F25B 21/02
[52] U.S. Cl. ................................. 62/3.7; 62/3.3; 204/241
[58] Field of Search .......................... 62/3.3, 3.7; 204/241

[56] References Cited

U.S. PATENT DOCUMENTS

| | | | |
|---|---|---|---|
| 3,075,360 | 1/1963 | Elfving et al. | 62/3.2 |
| 3,212,999 | 10/1965 | Sommers, Jr. | 62/3.2 |
| 3,366,164 | 1/1968 | Newton | 62/3.2 |
| 3,390,018 | 6/1968 | Habdas | 62/3.2 |
| 3,635,037 | 1/1972 | Hubert | 62/3.2 |
| 5,544,487 | 8/1996 | Attey et al. | 62/3.3 |

*Primary Examiner*—Henry Bennett
*Assistant Examiner*—Mark Shulman
*Attorney, Agent, or Firm*—Rogers & Killeen

[57] ABSTRACT

A heat pump system based on the Peltier effect, built around a transparent or translucent material element and formed by two sheets (1) in which chains of thermoelements (3, 4) are embedded, trapped or inserted, said thermoelements being connected along their respective alternate ends with the aid of parts (2) made of a material with good thermal and electric conductivity properties, which chains are liable of being supplied with external electric energy so that heat transport is based on the direction of the current flowing through said thermoelements.

16 Claims, 1 Drawing Sheet

PELTIER EFFECT HEAT PUMP

FIELD OF THE INVENTION

This invention refers to a Peltier effect steam pump which provides essentially novel features and considerable advantages over what is presently known in the state of the art.

Particularly, the invention proposes the development of a Peltier effect heat pump wherein all or part of its components are fabricated from transparent or translucent material and which comprises a plurality of thermoelectric elements arranged between transparent or translucent plates, either imbedded or simply intercalated in the material and organized according to a pre-established structure for the purpose being sought.

The field of application of the invention is related to the air conditioning and the heat transport and transmission sectors, involving heat pumping between two focal points: a source and a sink point.

BACKGROUND OF THE INVENTION

The current state of the art related to the object of the present invention shows, in general, considerable development in regard to systems which transport heat from a source to a sink using a fluid means of transport. However, very little development is evident in systems which utilize electric current as a means of transporting heat (Peltier effect: e.g. see application by A. Joffe, published under the title "Semiconductor Thermoelements and Thermoelectric Cooling", in Onfosearch, London, 1957).

Small size equipment units are presently being built, based on the Peltier effect, for very specific and limited applications. All said applications use conventional cells with constructive features which are very similar to one another: thermoelectric elements through which circulates an electric current giving rise to the known Peltier effect, enclosed in the form of a sandwich between two opaque ceramic or other material plates with good heat transport qualities (a development of this nature has been proposed by Miguel Sanz-Bosch, Rafael Palacios and Antonio Arenas in their paper titled "Thermoelectricity application to cryoconcentration process of fruit juices", International Conference of Thermoelectricity, Pasadena, 1996).

SUMMARY OF THE INVENTION

The proposed invention consists in the construction of generic cells or elements for specific applications, all or part of the components being transparent or translucent (glass, methacrylate, polyester, etc.). In the present invention, the thermoelectric elements are embedded in transparent or translucent material (cast, fitted, clasped, etc. in crystal, glass, plastic or similar), or are simply intercalated (sandwiched, clasped, etc.) between transparent or translucent plates.

Thus, the thermoelectric elements are conveniently grouped or arranged in a manner that, once the generic cells or the specific elements are installed in the desired location, and after supplying the necessary electric current, said parts offer the double function of providing visibility/passage of light and of pumping heat in the desired direction.

Therefore, the proposed invention may also be interpreted as a crystal, glass, plastic or simply flat/curved plate having a constant or variable thickness, either transparent or translucent, which upon adding certain elements arranged in a way that, although capable of partially (never fully) annulling their transparent or translucent property and after being supplied with external energy, the natural process of transmitting heat from the hottest to the coldest point may be modified either by enabling said natural process or by inverting it in a manner that the heat may be conveyed by pumping action from the lowest temperature focal point to the highest temperature focal point (active principle).

Two types of advantage are provided by the proposed system as compared to present heat pumps used for air conditioning and other applications:

Intrinsic to the Peltier effect, such as the absence of moving parts and the absence of heat transporting fluids, and comprised in the application system proposed by the invention, such as the use of a facing in the building itself for installing the heat pump system, with the resulting space saving, or, in the event of transparent or translucent facings, furthermore providing a reduction of their strong influence on the thermal loads applied to the air conditioning system, whatever the type. The reduction in facing luminosity or transparency does not normally constitute a construction problem nowadays, this being a sufficiently high factor.

BRIEF DESCRIPTION OF THE DRAWINGS

Other characteristics and advantages of the invention will become apparent from the following detailed description of a preferred embodiment, reference being made to the attached drawings in which, in the form of an example and thus with a non limiting character, said preferred embodiment is illustrated. In the drawings:

The single FIGURE shows a partially sectioned perspective view of one of the possible construction forms which, as defined hereunder, provides two embodiment alternatives.

DETAILED DESCRIPTION OF THE PREFERRED EMBODIMENT

Figure 1:
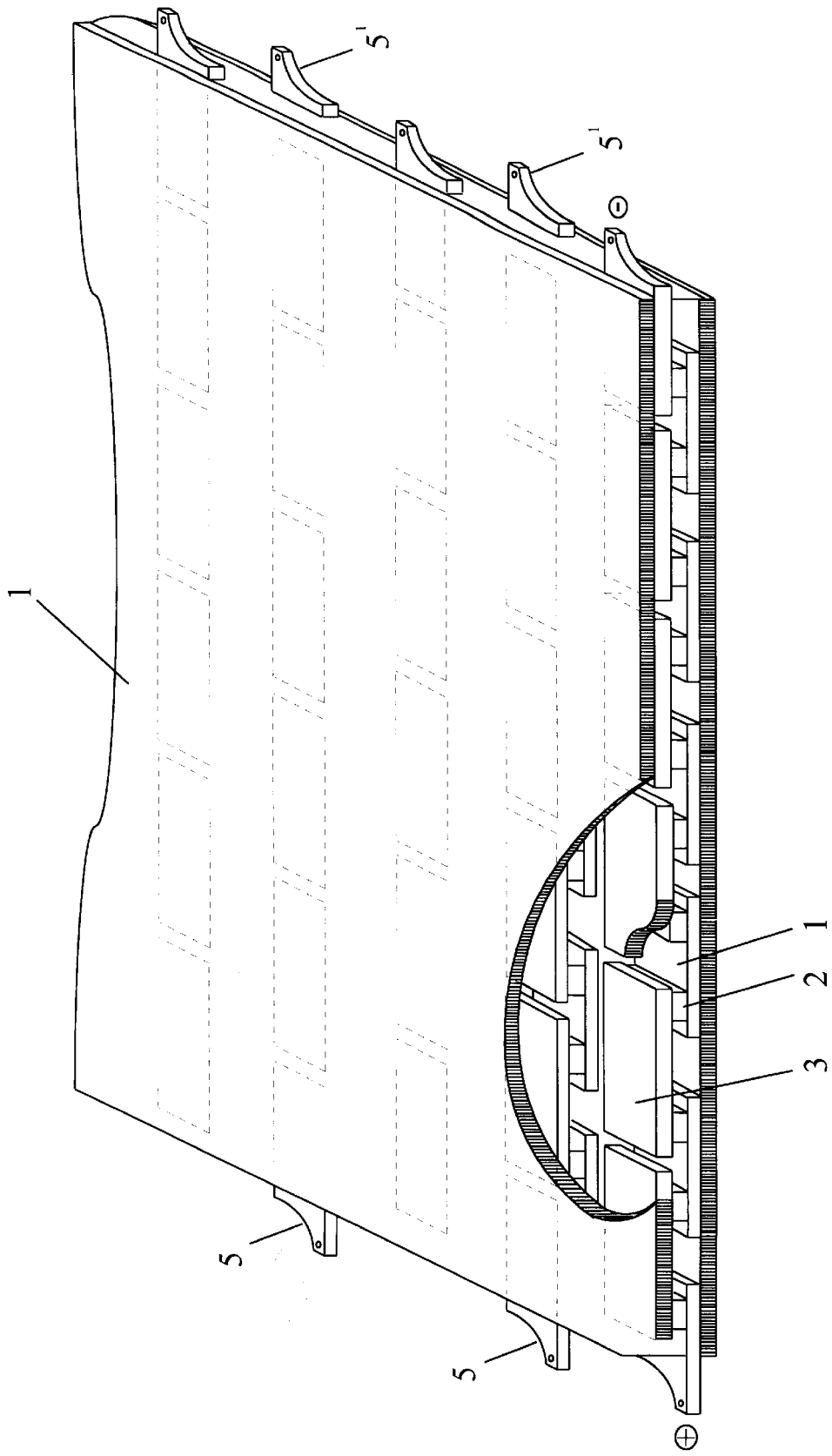

As previously stated, the preferred embodiment of the object of the invention is illustrated in the single FIGURE in the drawing, corresponding to an element fabricated according to this invention and shown partially in section to reveal its internal contents.

As shown, the overall invention comprises a plurality of internal chains formed by thermoelements built in the manner described hereunder, an external electric connection with these chains being established through end terminals (5, 5') projecting from the opposite sides of the assembly which form the element of the invention. When a specified potential difference is applied between said terminals (5, 5'), a direct electric current flow is generated through the various thermoelements comprised in each chain.

Any one chain comprised in the element of the invention is composed of thermoelements (3, 4) alternatively attached two by two via parts (2), so that the electric current passes once, but only once, through all said thermoelements. Whenever one thermoelement (3) is connected to another thermoelement (4) in the direction of the electric current, the connections with the parts (2) are implemented on the same side of the plate. However, when the connection involves one element (4) to another element (3) in the direction of the current, the connections with parts (2) are implemented on the opposite side of the plate. Thus, current flow produces heat transport (pumping) from one side of the plate to the other in each of the thermoelement pairs (3, 4), depending on the direction of the current.

The materials of the thermoelement identified by (3) are all the same, although their properties differ from those of the materials identified by reference (4), which in turn are all mutually alike.

Normally, the parts are made of copper or some other appropriate material with good thermal and electric conductivity.

It should be understood that all the chains contained in the element of the invention shown in the single FIGURE in the drawing behave in the previously explained manner, and all are liable to be electrically connected in series or parallel, but however in a manner that the heat is transported in the same direction.

The upper and lower plates, identified by reference number (1), support all the thermoelement chains comprised in the device, are electrically insulated from the exterior and provide structural strength to an assembly built with transparent or translucent material, as previously described.

As illustrated in the FIGURE of the drawing, the example of the embodiment involves a plurality of thermoelectrical element (3, 4) chains formed by connecting one thermoelement (3) to another thermoelement (4) (and vice versa), alternatively through the lower or upper part, by means of an intermediate part (2) having an appropriate configuration and built with a material having good thermal and electrical conductivity properties. A construction of this type enables the electric current to pass from one element to the next in a way that the order of the thermoelectrical materials in the direction of the current is the same for all the chains on the same side of the plate.

The connection between the thermoelements (3, 4) and the parts (2) can be implemented by welding. The connection between the various chains may also be achieved internally by means of welding or externally by means of cables.

The gap between the chains may be established on the basis of the functional characteristics desired for the assembly and on the transparency desired for the plate, the chain thermoelements normally being opaque.

As previously and specifically indicated, the preferred construction of the invention allows two alternative embodiments to be implemented, namely:

1) The thermoelement (3, 4) chains are trapped between the transparent or translucent insulating material sheets (1), e.g. glass, plastic or similar, forming a sandwich. The remaining gap, corresponding to the free voids between sheets and not occupied by the chain's thermoelements, may simply be filled with air or some other gas, or rarefied by vacuum;

2) The chains are embedded (encrusted) in the transparent or translucent material in each plate (1) or in the base material. The chains may be inserted in the plate prior to the solidification of the plate material, should the plate be formed by casting or molding.

The contents of the present description need not be more extensive for an expert on the subject to understand the scope of the invention and the advantages deriving therefrom, and to implement a practical embodiment of its object.

However, and in view that the description corresponds merely to an example of an embodiment, it should be understood that multiple detail variations may be introduced within the essence of the invention, particularly in regard to configuration, size and/or construction materials used in the assembly or parts thereof without departing from the inventive scope and limited only by the content of the following claims.

What is claimed is:

1. Element usable as a heat pump that takes advantage of the Peltier effect, characteristic in that it is transparent or translucent and is made of crystal, glass, plastic or similar material to form a flat or curved, constant or variable thickness plate (1) wherein thermoelements (3, 4) are arranged either on the surface or internally in a manner that, although partially (never fully) annulling the transparent or translucent property of the plate and after said thermoelements are supplied with external energy, the natural process of transmitting heat from the highest to the coldest temperature focus point is altered, according to the thermal conductivity of the plate assembly, either enhancing said natural process by transporting more heat from the hot to the cold focus point than corresponds to the plate assembly's thermal conductivity, or else inverting said natural process in a manner that heat is transported from the lower to the higher temperature focus.

2. Element according to claim 1, characteristic in that the transparent or translucent material internally incorporates a heat pump system without completely loosing its transparent or translucent property.

3. Element according to claim 2, characteristic in that the transparent or translucent material internally incorporates a Peltier effect heat pump system without completely loosing its transparent or translucent property.

4. Element according to claim 2, characteristic in that said thermoelements (3, 4) are grouped, each being connected to the next one through their respective opposite ends by parts (2), which have good thermal and electric conductivity properties.

5. Heat pump associated to the element described in claim 2, characteristic in that part or all of its components are built with transparent materials, so that heat pump action from one focus point to the other allows light to pass through, thus providing total or partial visibility.

6. Construction facing built on the basis of an element of the type claimed in claim 2, characteristic in that it is vertically, horizontally or slantingly positioned and fabricated from transparent, translucent or opaque material and internally incorporates a heat pump system.

7. Element according to claim 1, characteristic in that the transparent or translucent material internally incorporates a Peltier effect heat pump system without completely loosing its transparent or translucent property.

8. Element according to claim 7, characteristic in that said thermoelements (3, 4) are grouped, each being connected to the next one through their respective opposite ends by parts (2), which have good thermal and electric conductivity properties.

9. Heat pump associated to the element described in claim 7, characteristic in that part or all of its components are built with transparent materials, so that heat pump action from one focus point to the other allows light to pass through, thus providing total or partial visibility.

10. Construction facing built on the basis of an element of the type claimed in claim 7, characteristic in that it is vertically, horizontally or slantingly positioned and fabricated from transparent, translucent or opaque material and internally incorporates a heat pump system.

11. Element according to claim 1, characteristic in that said thermoelements (3, 4) are grouped, each being connected to the next one through their respective opposite ends by parts (2), which have good thermal and electric conductivity properties.

12. Heat pump associated to the element described in claim 11, characteristic in that part or all of its components are built with transparent materials, so that heat pump action from one focus point to the other allows light to pass through, thus providing total or partial visibility.

13. Construction facing built on the basis of an element of the type claimed in claim 11, characteristic in that it is vertically, horizontally or slantingly positioned and fabricated from transparent, translucent or opaque material and internally incorporates a heat pump system.

14. Heat pump associated to the element described in claim 1, characteristic in that part or all of its components are built with transparent materials, so that heat pump action from one focus point to the other allows light to pass through, thus providing total or partial visibility.

15. Construction facing built on the basis of an element of the type claimed in claim 1, characteristic in that it is vertically, horizontally or slantingly positioned and fabricated from transparent, translucent or opaque material and internally incorporates a heat pump system.

16. Construction facing, according to claim 15, characteristic in that it is vertically, horizontally or slantingly positioned and fabricated from transparent, translucent or opaque material and internally incorporates a Peltier effect heat pump system.

* * * * *